United States Patent
De Santis et al.

(10) Patent No.: US 9,875,799 B1
(45) Date of Patent: Jan. 23, 2018

(54) METHODS FOR PATTERN MATCHING USING MULTIPLE CELL PAIRS

(71) Applicant: MICRON TECHNOLOGY, INC., Boise, ID (US)

(72) Inventors: Luca De Santis, Avezzano (IT); Tommaso Vali, Sezze (IT); Kenneth J. Eldredge, Boise, ID (US); Vishal Sarin, Saratoga, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/991,007

(22) Filed: Jan. 8, 2016

Related U.S. Application Data

(60) Provisional application No. 62/102,168, filed on Jan. 12, 2015.

(51) Int. Cl.
| | |
|---|---|
| *G11C 11/34* | (2006.01) |
| *G11C 15/04* | (2006.01) |
| *G11C 16/10* | (2006.01) |
| *G11C 16/04* | (2006.01) |

(52) U.S. Cl.
CPC ........ *G11C 15/046* (2013.01); *G11C 16/0483* (2013.01); *G11C 16/10* (2013.01)

(58) Field of Classification Search
None
See application file for complete search history.

(56) References Cited

U.S. PATENT DOCUMENTS

| | | | |
|---|---|---|---|
| 5,706,224 A | 1/1998 | Srinivasan et al. | |
| 6,000,008 A | 12/1999 | Simcoe | |
| 6,597,595 B1 | 7/2003 | Ichiriu et al. | |
| 6,665,202 B2 | 12/2003 | Lindahl et al. | |
| 6,813,174 B1 | 11/2004 | Srinivasan | |
| 7,003,624 B2 | 2/2006 | Regev et al. | |
| 7,209,391 B2* | 4/2007 | Urabe | G11C 16/24 365/100 |
| 7,889,727 B2 | 2/2011 | Miller et al. | |
| 8,046,532 B2 | 10/2011 | Owsley et al. | |
| 8,196,017 B1 | 6/2012 | Gupta | |
| 9,436,402 B1* | 9/2016 | De Santis | G06F 3/0628 |
| 2004/0015753 A1 | 1/2004 | Patella et al. | |
| 2004/0024960 A1 | 2/2004 | King et al. | |
| 2004/0114411 A1* | 6/2004 | Noda | G11C 15/043 365/49.17 |
| 2005/0027932 A1 | 2/2005 | Thayer | |
| 2012/0117431 A1 | 5/2012 | Bremler-Barr et al. | |
| 2012/0218822 A1* | 8/2012 | Roohparvar | G11C 15/046 365/185.17 |
| 2014/0347933 A1* | 11/2014 | Lee | G11C 15/046 365/185.17 |

* cited by examiner

*Primary Examiner* — Harry W Byrne
*Assistant Examiner* — Sultana Begum
(74) *Attorney, Agent, or Firm* — Dicke, Billig & Czaja, PLLC

(57) ABSTRACT

Memories having a plurality of cell pairs, where each cell pair of the plurality of cell pairs is programmed to store a same bit of data corresponding to a particular bit position of a pattern to be searched in a memory are useful in mitigating match errors, such as in a CAM (Content Addressable Memory) memory device.

25 Claims, 10 Drawing Sheets

METHODS FOR PATTERN MATCHING USING MULTIPLE CELL PAIRS

RELATED APPLICATION

This application claims the benefit of U.S. Provisional Application No. 62/102,168, filed on Jan. 12, 2015, which is incorporated herein in its entirety by reference.

FIELD

The present disclosure relates generally to memory and in particular, in one or more embodiments, the present disclosure relates to methods and apparatus for pattern matching.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as digit (e.g., bit) lines. In NAND flash architecture, a column of memory cells is coupled in series with only the first memory cell of the column coupled to a bit line.

Content addressable memories (CAM) are memories that implement a lookup table function in a single clock cycle. They use dedicated comparison circuitry to perform the lookups. CAM application are often used in network routers for packet forwarding and the like. Each individual memory bit in a CAM requires its own comparison circuit in order to allow the CAM to detect a match between a bit of the key word (e.g., pattern) with a bit stored in the CAM. Typical CAM cells, then, use approximately nine to ten transistors for a static random access memory (SRAM)-based CAM, or four to five transistors for a dynamic random access memory (DRAM)-based CAM.

In a two cell NAND CAM, one bit of data is stored in a pair of cells, each cell being programmed to one of at least two data states (S0, S1). One bit of a pattern is coded as two read voltages on word lines (Vr0, Vr1) of the pair of cells. A combination of read voltages and cell states is used to determine a match/no-match condition for a bit, e.g., when the bit of the pattern is concordant with the data of a cell pair (e.g., cell pair does not conduct), a match may be indicated, and when the bit of the pattern is opposite of the data of the cell pair (e.g., cell pair conducts), a no-match condition may be indicated. Pass voltages are used to remove cell pairs in a string that are not to be part of a match operation, e.g., cause these cell pairs to conduct regardless of their data states. Typically, a determination of a match/no-match condition for a data pattern will examine a plurality of cell pairs connected in parallel to a bit line. If all cell pairs under examination match, then no conduction will be present on the bit line (e.g., a precharged data line), which will not discharge, indicating a match for the cell pairs under examination. If any cell pair under examination does not match, e.g., both cells of at least one cell pair conduct, the bit line (e.g., a precharged data line) is discharged, indicating a no-match condition.

FIG. 1 shows a basic two cell NAND CAM. Such a CAM is described in greater detail in U.S. patent application Ser. No. 13/449,082, filed Apr. 17, 2012, titled "METHODS AND APPARATUS FOR PATTERN MATCHING". In a two cell NAND CAM 100, one bit of data can be stored as threshold voltages (representing data states) in two cells, 102 and 104. A logical 0 value for a bit of data programmed into two cells 102 and 104 can be represented by a first threshold voltage of 3 volts (e.g., within the data state S1) on the first cell (e.g., cell 102) and a second threshold voltage of 1 volt (e.g., within the data state S0) on the second cell (e.g., cell 104), and a logical 1 value for a bit of data programmed into two cells can be represented by a first threshold voltage of 1 volt (e.g., within the data state S0) on the first cell (e.g., cell 102) and a second threshold voltage of 3 volts (e.g., within the data state S1) on the second cell (e.g., cell 104). Although specific voltage levels are provided herein for ease of understanding, they are merely examples and may vary depending upon the particular memory technology utilized and other operation parameters.

A pattern to be matched in the memory is stored or received as well. Each bit of the pattern to be matched is represented by two voltages on word lines (e.g., Vr0 and Vr1). For example, a logical 0 value for a pattern bit may cause a voltage of 2 volts (e.g., Vr0, a voltage sufficient to activate a cell having the S0 data state but not activate a cell having the S1 data state) to be applied to the gate of the first cell (e.g., cell 102) of the two cells, and may cause a voltage of 4 volts (e.g., Vr1, a voltage sufficient to activate a cell having the S1 data state) to be applied to the gate of the second cell (e.g., cell 104) of the two cells. A logical 1 value for a pattern bit may cause a voltage of 4 volts (e.g., a voltage sufficient to activate a cell having the S1 data state) to be applied to the gate of the first cell (e.g., cell 102) of the two cells, and may cause a voltage of 2 volts (e.g., a voltage sufficient to activate a cell having the S0 data state but not activate a cell having the S1 data state) to be applied to the gate of the second cell (e.g., cell 104) of the two cells. A comparison is made to a representation of data stored in the array, where each bit of stored data is also represented by two cells, each having its own programmed threshold voltage. A register may be used to store the pattern of bits, e.g., two bits of the register for each bit of the pattern.

With these threshold voltages and word line voltages, a no-match between the data stored in the cells 102 and 104 is determined when both cells conduct, and the bit line (e.g., precharged data line) for those cells discharges. When at least one cell does not conduct, a match condition is determined. FIG. 2 shows basic no-match 202 and match 204 conditions for a two cell NAND CAM. For the example of FIG. 2, cell 102 has the S0 data state and cell 104 has the S1 data state. As such, if voltage Vr0 is applied to word line WL0 and voltage Vr1 is applied to word line WL1, both cells 102 and 104 conduct as each voltage is sufficient to activate its respective cell 102 or 104. Conversely, if voltage Vr1 is applied to word line WL0 and voltage Vr0 is applied to word line WL1, cell 104 does not conduct as the voltage Vr0 is insufficient to activate cell 104. Although cell 102 would be activated in this situation, the cell pair 102/104 does not conduct as a result of their series connection.

A false match condition in NAND CAM cells can be a critical issue. A false match occurs when a cell that should be conducting moves to being a non-conducting cell. NAND memory has some inherent reliability issues. In a situation where pattern matching as in a NAND CAM memory is being performed, the reliability of NAND memory limits its application.

For the reasons stated above, and for other reasons stated below which will become apparent to those skilled in the art upon reading and understanding the present specification, there is a need in the art for increased reliability of NAND CAM memories.

DETAILED DESCRIPTION

Figure 1:
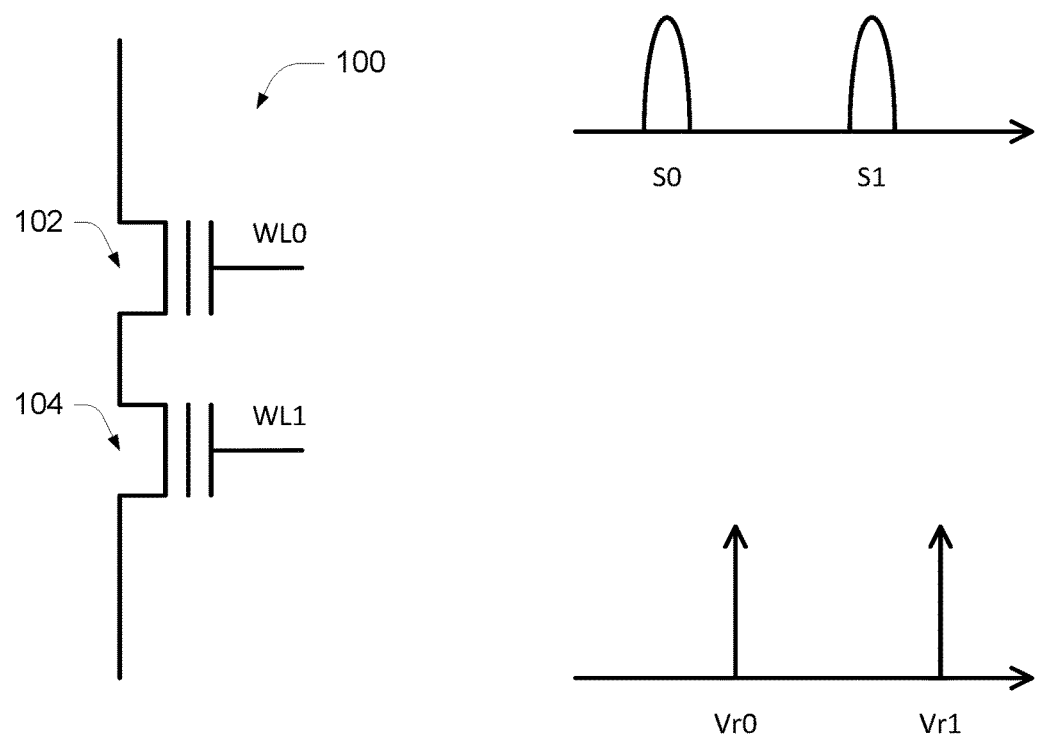
FIG. 1 is a diagram of a two cell NAND CAM portion of a memory array.
Figure 2:
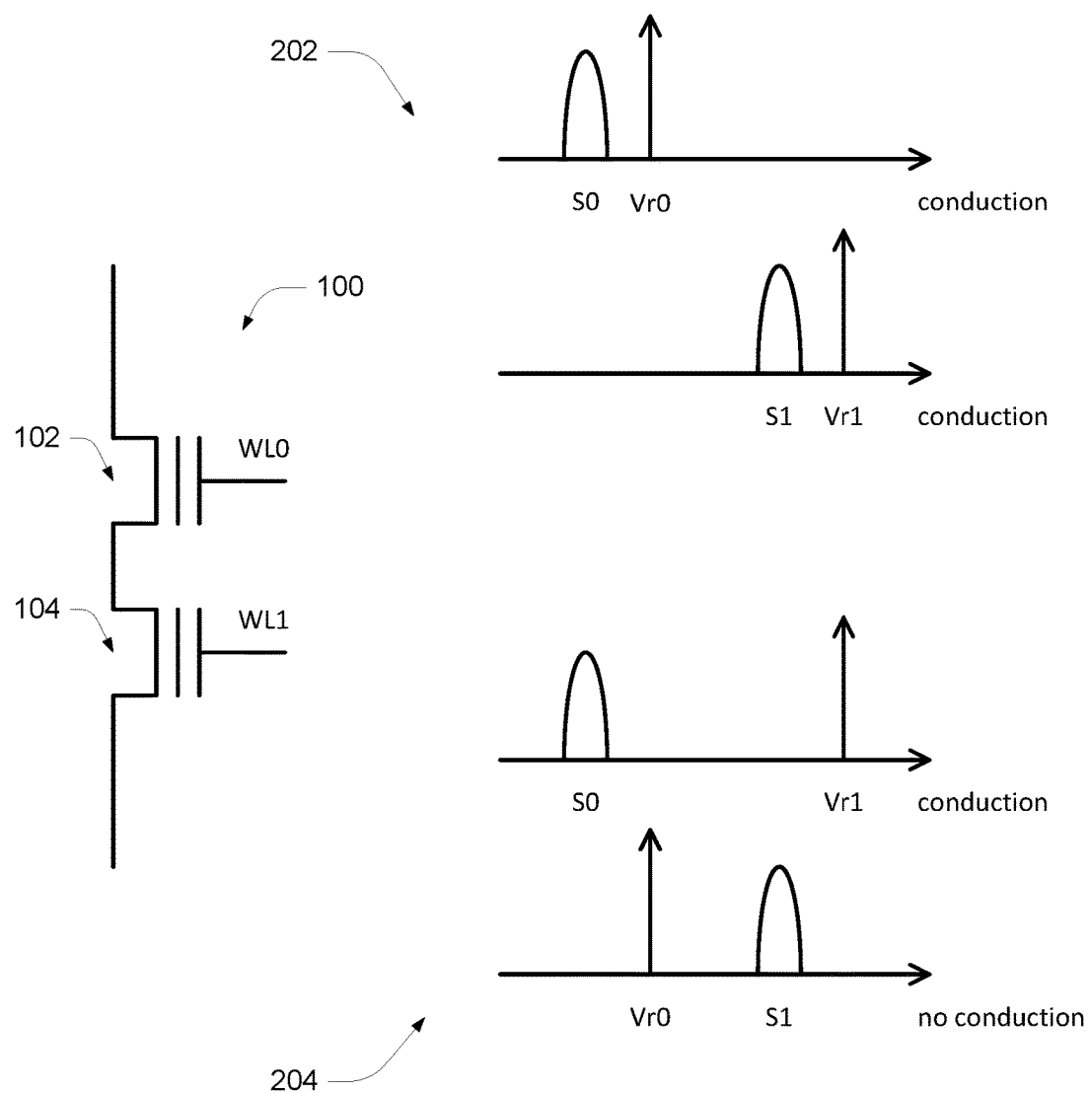
FIG. 2 is a diagram of matching in a two cell NAND CAM such as that shown in FIG. 1.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense.

Figure 3:
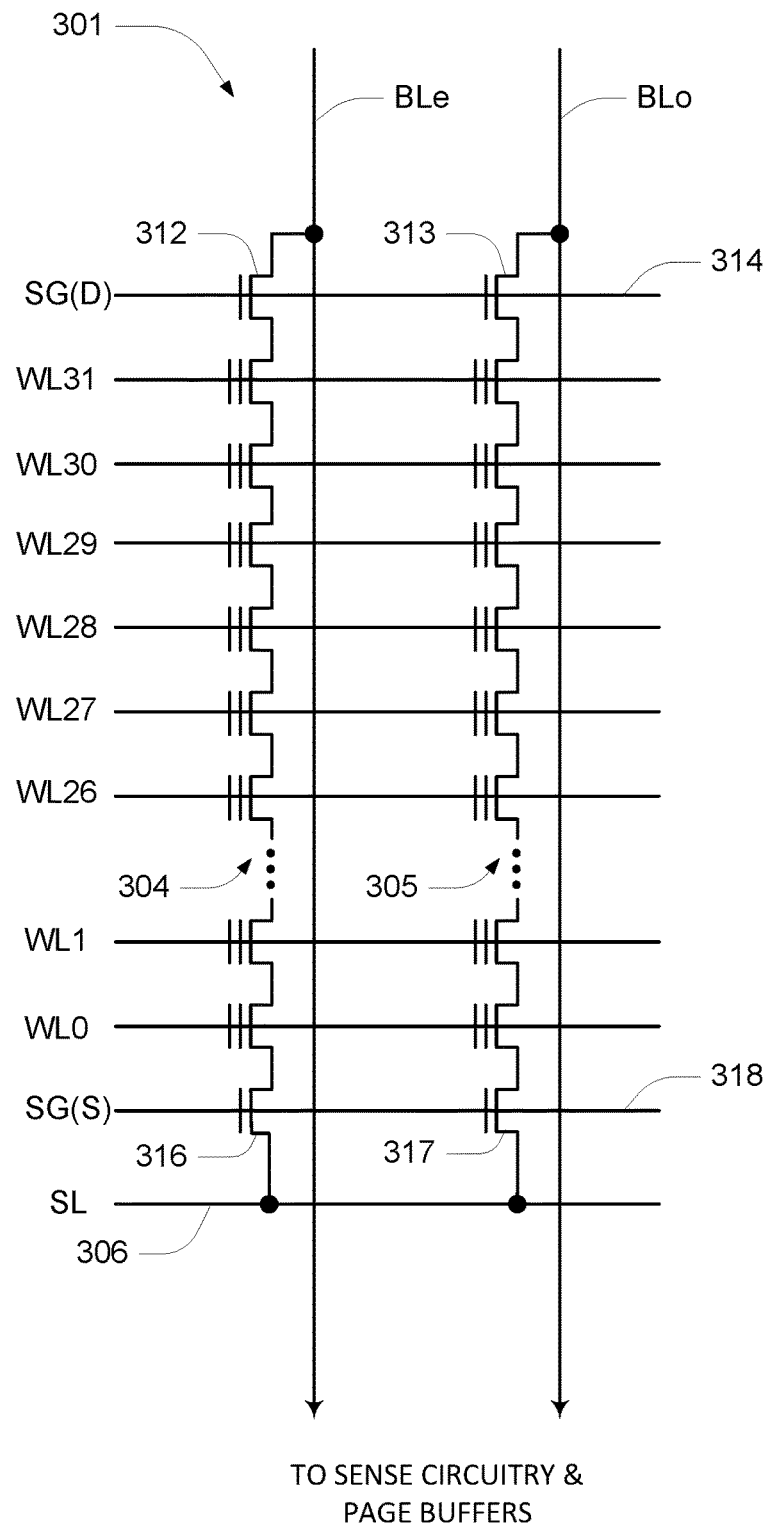
FIG. 3 is a schematic diagram of one embodiment of a portion of a memory array.

FIG. 3 illustrates a schematic diagram of one embodiment of a portion of a NAND architecture memory array 301 comprising series strings of non-volatile memory cells. The present embodiments of the memory array are not limited to the illustrated NAND architecture.

The memory array 301 comprises an array of non-volatile memory cells (e.g., floating gate) arranged in columns such as series strings 304, 305. Each of the cells is coupled in series (e.g., drain to source) in each series string 304, 305. An access line (e.g., word line) WL0-WL31 that spans across multiple series strings 304, 305 is coupled to the control gates of each memory cell in a row in order to bias the control gates of the memory cells in the row. Data lines, such as even/odd bit lines BLe, BLo, are coupled to the series strings and eventually coupled to sense circuitry (e.g., sense amplifier) (not shown) that detects the state of each cell by sensing current or voltage on a selected bit line. The bit lines BLe, BLo are also coupled to page buffers (not shown) that can be programmed by data from each selected word line. The sense circuitry and page buffers may be part of the same circuitry or the page buffers can be separate circuitry.

Each series string 304, 305 of memory cells is coupled to a source line 306 by a source select gate 316, 317 (e.g., transistor), and to an individual even or odd bit line BLe, BLo by a drain select gate 312, 313 (e.g., transistor). The source select gates 316, 317 are controlled by a source select gate control line SG(S) 318 coupled to their control gates. The drain select gates 312, 313 are controlled by a drain select gate control line SG(D) 314.

In a typical programming of the memory array, each memory cell is individually programmed as either a single level cell (SLC) or a multiple level cell (MLC). The cell's threshold voltage ($V_t$) can be used as an indication of the data stored in the cell. For example, in an SLC, a $V_t$ of 2.5V might indicate a first data state while a $V_t$ of −0.5V might indicate a second data state. An MLC uses multiple $V_t$ ranges that each indicates a different data state. Multiple level cells can take advantage of the analog nature of a traditional charge storage cell by assigning a respective bit pattern to each of the data states.

Figure 4:
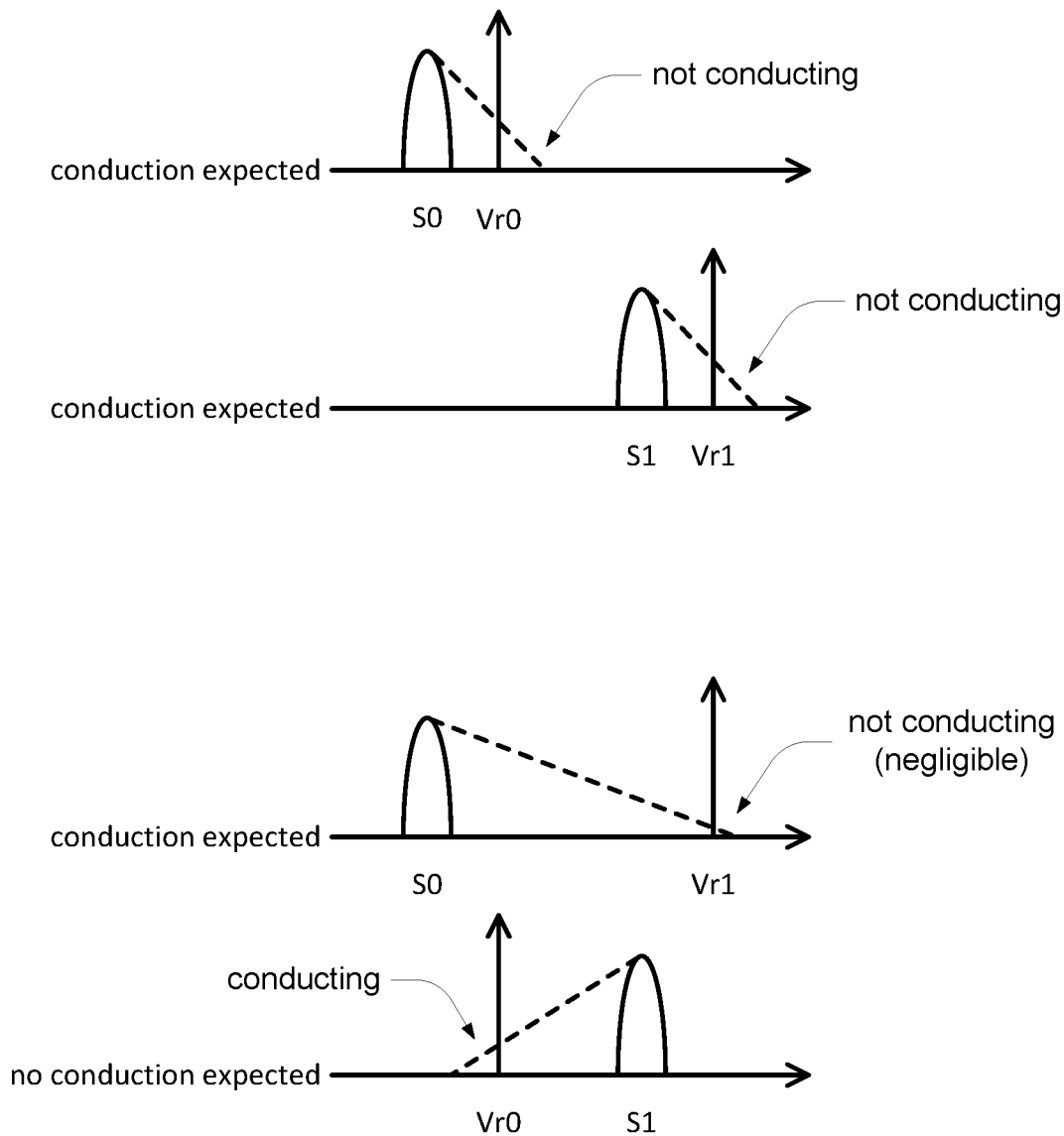
FIG. 4 is a diagram showing possible error sources in a CAM memory.

When there is uncertainty in program/read/verify operations, a cell can be read as conducting when it is expected not to be conducting, or can be read as not conducting when it is expected to be conducting. Either instance may result in a match error. When a cell that is conducting becomes not conducting because of some error, that may be a more serious error. A cell that is not conducting becoming conducting is less an issue in pattern matching because such an error is only one conducting cell that should not be conducting, and a bit error would depend on all cells conducting when conduction is not expected, and patterns are typically quite large. The probability that one cell is reading incorrectly is referred to as the bit error rate (BER). Given a BER, the probability that a pair of cells, such as cells 102 and 104 described above, storing a bit of data matching a bit of the pattern becoming a pair of cells that do not match the bit of the pattern is equal to the BER. Basic error sources for a two cell NAND CAM are shown in FIG. 4.

Figure 5:
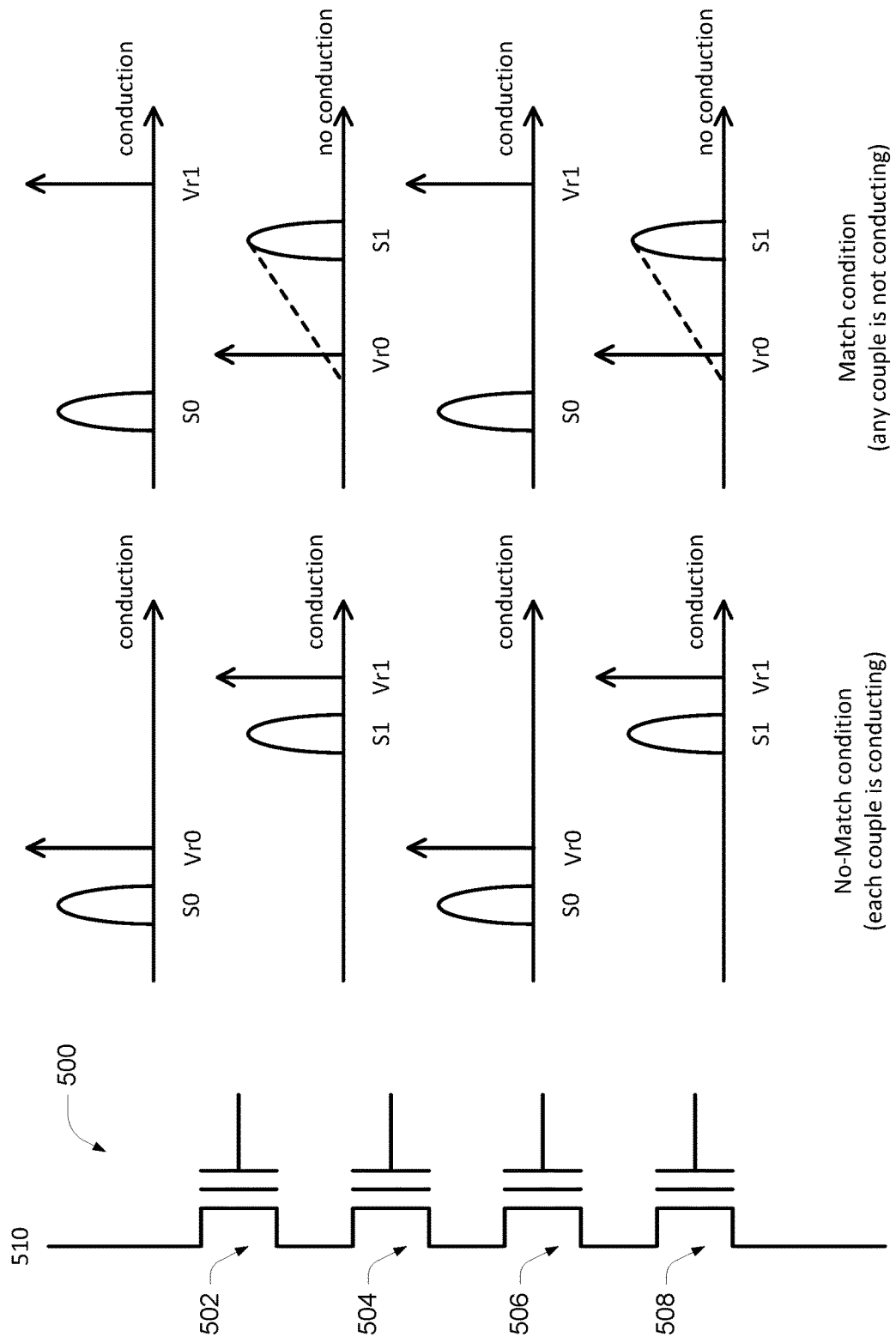
FIG. 5 is a diagram of a portion of a memory according to an embodiment of the disclosure.

One embodiment 500 for reducing the error rate for a NAND CAM is shown in FIG. 5. In this embodiment, a CAM cell is formed from four individual memory cells 502, 504, 506, and 508, comprising two pairs of two cells storing in one embodiment duplicate data. In one embodiment, cells 502 and 504 represent a bit of data like cells 102 and 104 of FIG. 1, and that bit of data is duplicated into cells 506 and 508 in series on the same string 510. Therefore, in this embodiment a single bit of data (e.g., corresponding to a particular bit position of a pattern of data) is represented by four cells, with each pair of cells (502/504 and 506/508) programmed to store the same bit of data. Note that although each cell pair is programmed to store the same bit of data (e.g., they have been subjected to programming operations seeking to adjust their threshold voltages to represent the same data values), errors may occur such that a particular cell pair may not contain its intended bit of data. Given a four cell CAM and a known BER, a probability that a match condition reads as a no-match condition is equal to the BER squared. Extending the number of cells used to represent a single bit exponentially decreases the probability of error. For example, extending to eight cells, the probability of a match condition reading as a no-match condition is $BER^4$, and extending to N cells, the probability of a match condition reading as a no-match condition is $BER^{(N/2)}$.

Figure 6:
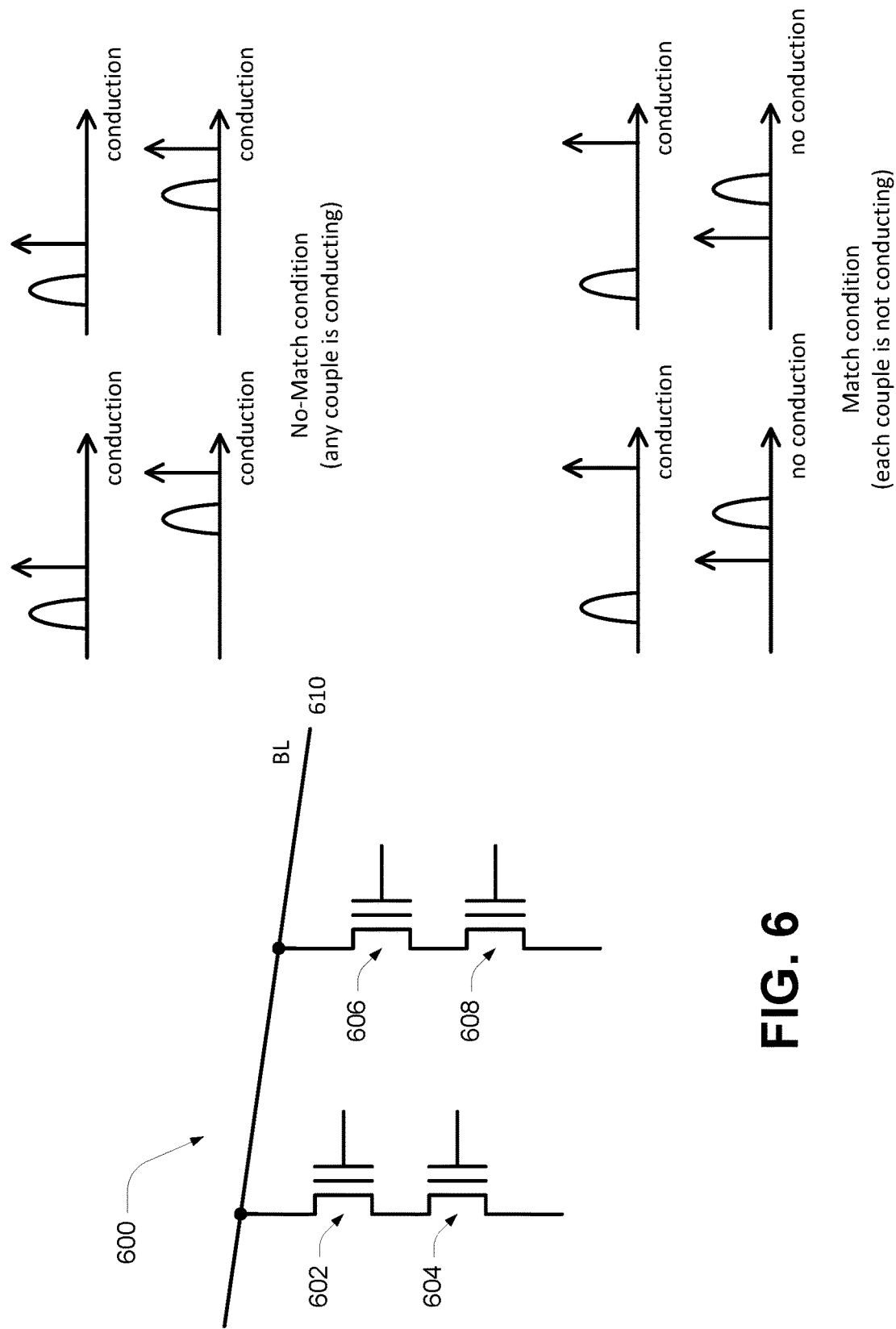
FIG. 6 is a diagram of a portion of a memory according to another embodiment of the disclosure.

Another embodiment 600 for reducing the probability of error due to BER is shown in FIG. 6. Embodiment 600 duplicates data along a bit line direction. In this embodiment, multiple cell pairs such as cells 102 and 104 are aligned in parallel along a same bit line. As shown, cells 602 and 604 represent a bit of data, and cells 606 and 608 represent a bit of data. Each pair of cells (602/604 and 606/608) in one embodiment are programmed to store the same bit of data (e.g., corresponding to a particular bit position of a pattern to be searched). Note that although each cell pair is programmed to store the same bit of data (e.g., they have been subjected to programming operations seeking to adjust their threshold voltages to represent the same data values), errors may occur such that a particular cell pair may not contain its intended bit of data. In this embodiment, the bits are stored in parallel along bit line 610. If either cell pair conducts, there is a no-match condition. If neither cell pair conducts, there is a match condition. Therefore, in order to change a no-match result to a match result, each cell pair must have an error in which a conducting cell becomes a non-conducting cell. If P is the probability that a conducting cell becomes non-conducting, then the probability of a no-match condition being read as a match condition is $2P*2P=4P^2$. When reliability of a NAND CAM cell, which is related to the BER, becomes more important, a lower probability of error through the use of additional cells such as in the present embodiments may be used.

Figure 7:
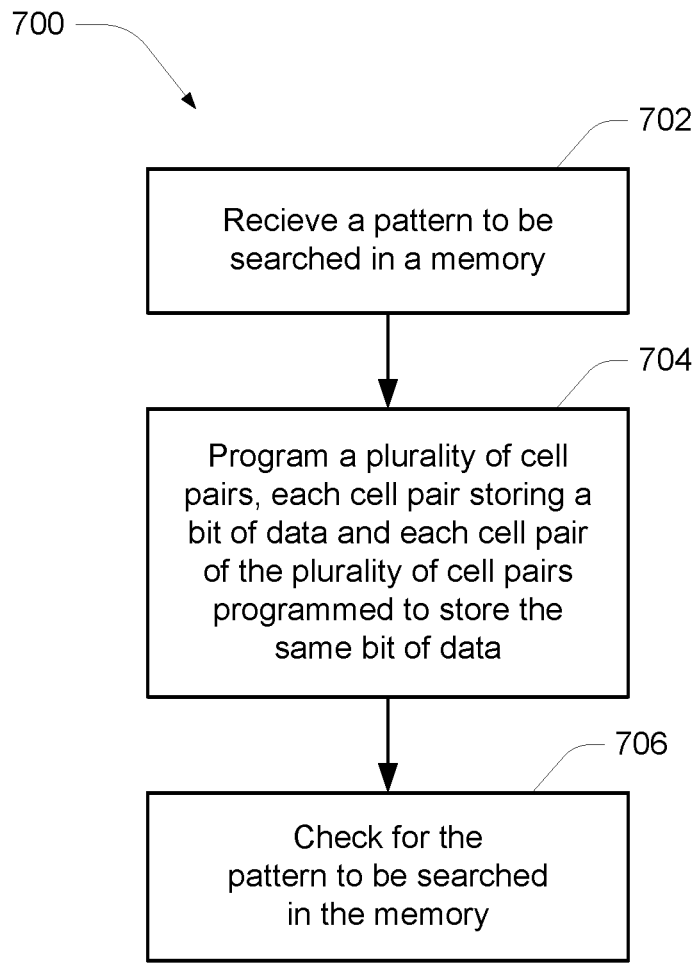
FIG. 7 is a flow chart diagram of a method according to another embodiment of the present disclosure.

A method 700 of pattern matching in a NAND CAM is shown in flow chart form in FIG. 7. Method 700 comprises, in one embodiment, receiving a pattern to be searched in a memory in block 702, programming a plurality of cell pairs, each cell pair storing a bit of data and each cell pair of the plurality of cell pairs programmed to store the same bit of data in block 704, and checking for the pattern to be searched in the memory in block 706. The bit of data of the plurality of cell pairs corresponds to a particular bit position of a pattern to be searched. In one embodiment, where the cell pairs are aligned in parallel along a same bit line, determining that a match condition is met (e.g., for the particular bit position of the pattern to be searched) occurs when each of the plurality of cell pairs is non-conducting (e.g., indicating a match to the data value of the particular bit position), and determining that a no-match condition is met occurs when any of the plurality of cell pairs is conducting. In another embodiment, where the cell pairs are connected in series in a same string, determining that a match condition is met (e.g., for the particular bit position of the pattern to be searched) occurs when any of the plurality of cell pairs is non-conducting (e.g., indicating a match to the data value of the particular bit position), and determining that a no-match condition is met occurs when each of the plurality of cell pairs is conducting. Two cell pairs are used in one embodiment. However, should increased reliability be desired, additional cell pairs may be used. As shown in FIG. 5, in one embodiment the plurality of cell pairs are connected in series in a same string. As shown in FIG. 6, in another embodiment the plurality of cell pairs are aligned in parallel along a same bit line. Although depicted in linear fashion in FIG. 7, the method need not be performed in order. For example, programming the plurality of cell pairs may occur before and/or after receiving the pattern to be searched in the memory.

The pattern (e.g., key word) to be searched in one embodiment comprises bits, with each bit of the pattern programmed into (e.g., represented by) two bits of a register, and gate voltages are applied to gates of the respective cells of a cell pair of the memory responsive to the two programmed bits. Pattern checking on a cell pair further comprises in one embodiment applying programmed gate voltages of a selected bit of the pattern to be searched to the two respective cells of the stored data.

Figure 8:
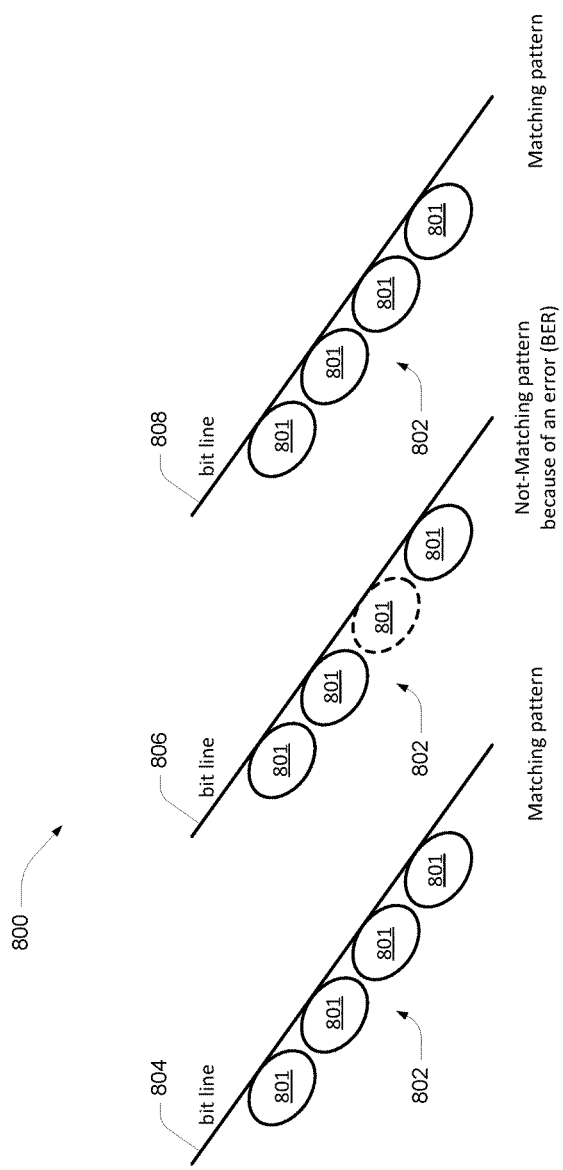
FIG. 8 is a diagram of a portion of a memory according to another embodiment of the disclosure.

Another embodiment 800 for reducing match probability errors is shown in FIG. 8. The embodiment of FIG. 8 duplicates the same pattern 802 in a plurality of memory elements 801 on each of a plurality of bit lines 804, 806, and 808. Each memory element 801 represents one or more cell pairs representing a bit of data of the pattern 802. Thus, each memory element 801 of a set of memory elements of a particular pattern 802 corresponds to a particular bit position of a pattern to be searched, and each set of memory elements 801 corresponds to the same set of bit positions of the pattern to be searched. When using more than one cell pair for a memory element 801, the cell pairs of the memory element 801 can be connected in series, such as described with reference to FIG. 5, and/or in parallel, such as described with reference to FIG. 6. Note that although each memory element 801 is programmed to store the same bit of data (e.g., they have been subjected to programming operations seeking to adjust their threshold voltages to represent the same data values), errors may occur such that a particular memory element 801 may not contain its intended bit of data. For example, the memory element 801 coupled to data line 806 and shown in dashed line may not contain its intended data value. After the pattern 802 is duplicated, a majority check on matching for the duplicated patterns 802 may be performed. Checking is performed as normal for each pattern 802 on each bit line 804, 806, and 808. Whatever result, matching or no-matching, that is in the majority is assigned as the true result. For example, if the pattern 802 is duplicated on three bit lines 804, 806, and 808, then whatever indication, match or no-match, occurs on two or more, e.g., a majority, of the bit lines, is the accepted result. In the case of three bit lines, then a match on two bit lines indicates a match, and a match on three bit lines indicates a match. In the example of FIG. 8, even though bit line 806 indicates a no-match condition, a match condition would be indicated for the pattern 802 as bit lines 804 and 809 (e.g., a majority) indicate match conditions. In the general case, duplicating a pattern N times on N bit lines, and accepting a match when K or more patterns of the N patterns are matching, gives a final probability error that at most K−1 patterns are not matching of:

$$\sum_{i=0}^{K-1} \binom{n}{i} p^i (1-p)^{n-i} \tag{1}$$

$$\binom{n}{k} = \frac{n!}{k!(n-k)!} \tag{2}$$

where p is the probability that one pattern has at least one matching error, and m is the key or pattern length, then $$p = 1 - (1 - BER)^m \quad (3)$$

Figure 9:
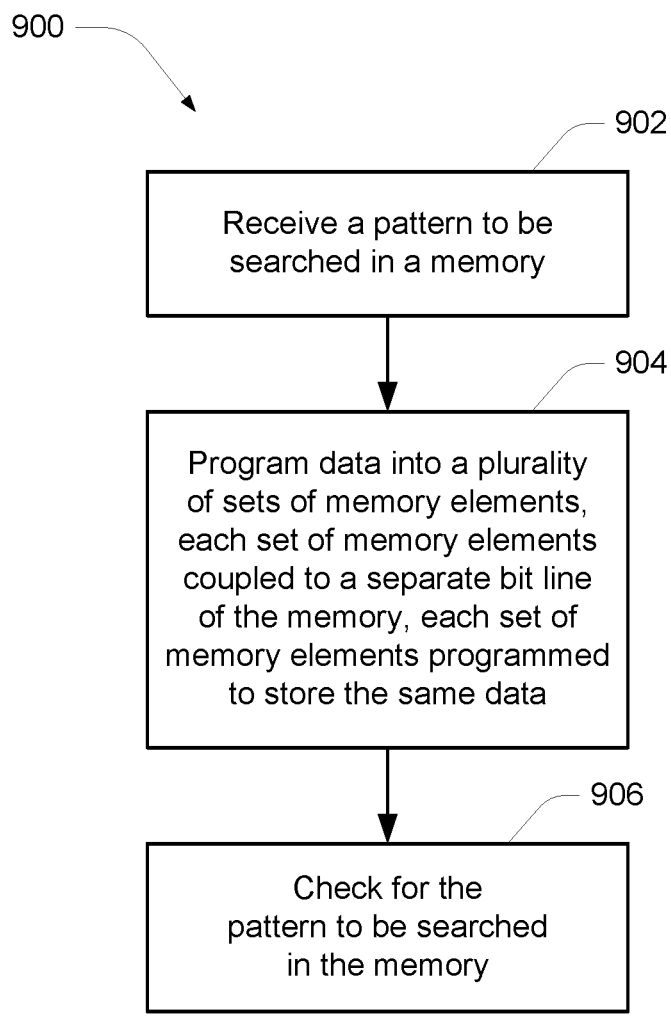
FIG. 9 is a flow chart diagram of a method according to another embodiment of the present disclosure.

A method 900 of pattern matching according to this embodiment is shown in flow chart form in FIG. 9. Method 900 comprises, in one embodiment, receiving a pattern to be searched in a memory in block 902, and checking for the pattern to be searched in the memory. Checking for the pattern further comprises in one embodiment programming data into a plurality of sets of memory elements, each set of memory elements coupled to a separate bit line of the memory, each set of memory elements programmed to contain the same data in block 904 (e.g., each corresponding to a same set of bit positions of the pattern to be searched), and checking for the pattern to be searched in the memory within each set of memory elements of the plurality of sets of memory elements in block 906. In one embodiment, a match condition is met when a majority of the bit lines coupled to the plurality of sets of memory elements indicates a match for the pattern to be searched. Programming data into a plurality of sets of memory elements in one embodiment comprises programming data into three sets of memory elements along three data lines. In another embodiment, a matching condition is met when the plurality of sets of memory elements numbers N, and when at least K sets of memory elements of the N sets of memory elements indicate a match. For one embodiment, K is greater than N/2. Although depicted in linear fashion in FIG. 9, the method need not be performed in order. For example, programming data into the plurality of memory elements may occur before and/or after receiving the pattern to be searched in the memory.

The methods described herein are orthogonal. Redundancy may be added to a NAND CAM in different ways, such as in the direction of a string, in the direction of a bit line, and/or in the direction of duplicating on bit lines. Embodiments of the present disclosure extend a number of cells in a string direction to decrease a probability that a match condition is read as a no-match condition, extend a number of cells in a bit line direction to decrease a probability that a no-match condition is read as a match condition, and/or repeat patterns on multiple bit lines for a majority matching check.

Figure 10:
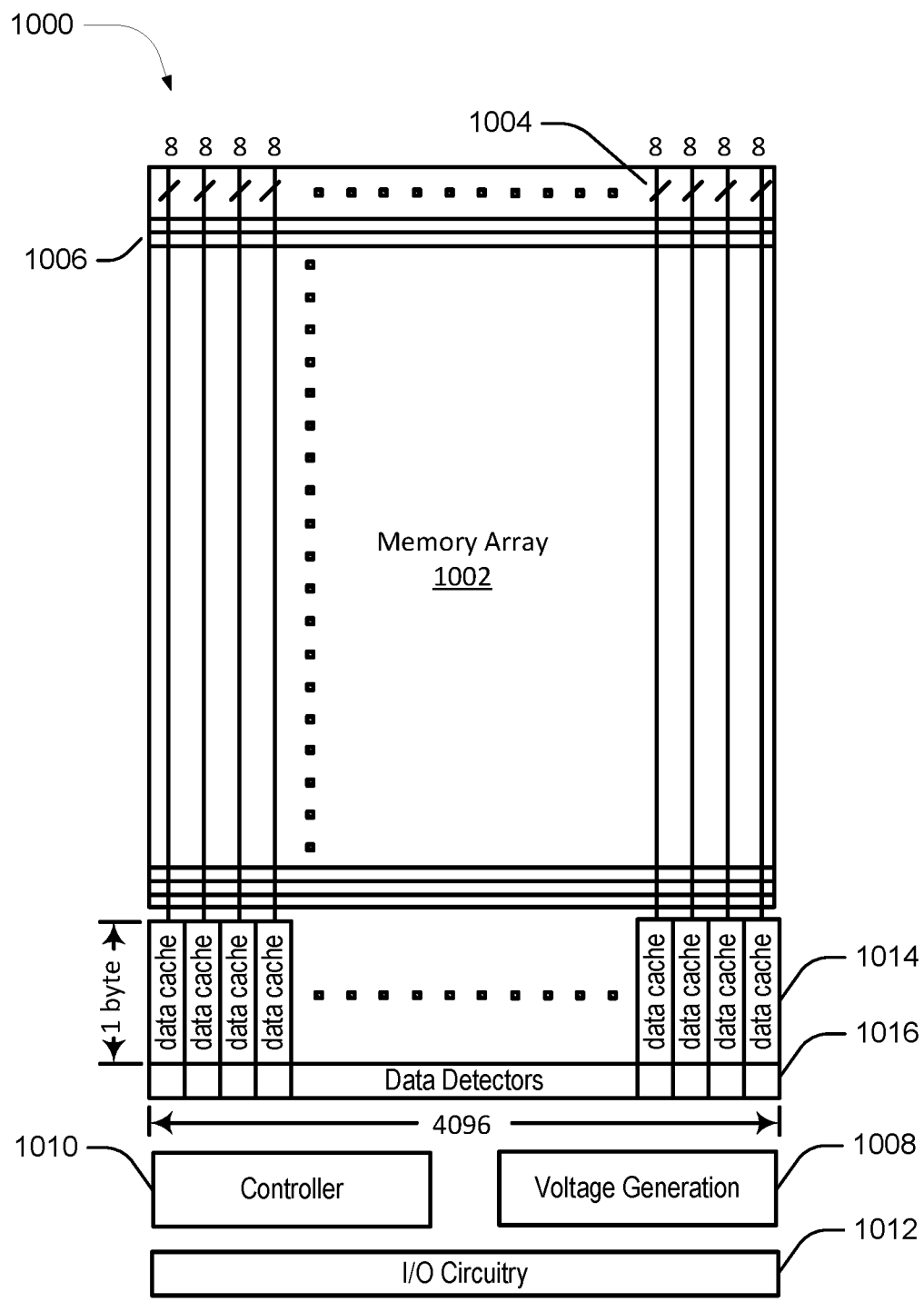
FIG. 10 is a block schematic of a memory in accordance with an embodiment of the disclosure.

Methods described herein, such as shown and described with reference to FIGS. 3 and 5-9, may be performed by a memory, such as the example memory 1000 illustrated in FIG. 10. Referring generally to FIG. 10, the memory (e.g., a NAND flash memory device) 1000 typically comprises a memory array 1002 divided into columns (accessed by data lines 1004, such as those commonly referred to as bit lines) and rows (accessed by access lines 1006, such as those commonly referred to as word lines), a voltage generation system 1008, a controller 1010, input/output circuitry 1012 for command and data transfers, and a plurality of page buffers 1014. Each page buffer is coupled to one or more bit lines 1004 and has one or more data cache registers which are used to latch data sensed from the array during a read or verify operation, and to store data to be programmed into the array. The plurality of page buffers 1014 is further coupled to a bank 1016 of data detectors. The data cache registers of the plurality of page buffers 1014 may further store a pattern (e.g., data pattern) to be searched in, or programmed into, the memory 1000. The plurality of page buffers 1014 can perform basic logic functions, such as AND, OR, and NOT operations, on the data stored in its registers. Each page buffer of the plurality of page buffers 1014 is coupled to one data detector of the bank 1016 of data detectors. Each data detector provides circuitry to determine whether data in a corresponding page buffer indicates a match or no-match condition for a corresponding bit line 1004.

The controller 1010 may load a pattern to be searched into data cache registers of the plurality of page buffers 1014. The pattern may be received by the memory 1000 through the I/O circuitry 1012, such as might be received from an external device (e.g., a host device or memory controller) (not shown). The controller 1010 may then select voltages in response to the pattern to be searched, and apply those voltages, such as generated by voltage generation system 1008, to word lines 1006 to drive selected cell pairs coupled to bit lines 1004 to indicate their corresponding match/no-match condition depending upon the selected voltages applied to their control gates. Data indicative of the voltage responses of the bit lines 1004 indicating their corresponding match/no-match condition is stored in data cache registers of the plurality of page buffers 1014 for use by the bank 1016 of data detectors.

In searching for a pattern in the memory array 1002, the controller 1010 may begin searching at a starting address corresponding to a location in the memory array 1002, and may continue searching through incremented addresses until either a match is indicated or an ending address is reached. In programming a pattern of data into the memory array 1002, the controller 1010 may program a first data state into one memory cell of each cell pair of a plurality of cell pairs, and program a second data state into the other memory cell of each cell pair of the plurality of cell pairs for each bit position of the pattern. Which memory cell of a cell pair receives the first data state and which memory cell of the cell pair receives the second data state is determined by a data value of the corresponding bit position of the pattern to be programmed. Circuitry involved in carrying out methods described herein (e.g., controller 1010, bank 1016 of data detectors, plurality of page buffers 1014, etc.) may collectively be referred to as control circuitry. Although not necessary for an understanding of the embodiments described herein, a memory such as memory 1000 is described in more detail in U.S. patent application Ser. No. 13/449,082, filed Apr. 17, 2012, and titled "METHODS AND APPARATUS FOR PATTERN MATCHING."

While one set of threshold voltages and gate voltages are described herein, it should be understood that as cell structures vary, or array and threshold voltages change, different sets of voltages may be used without departing from the scope of the disclosure.

CONCLUSION

Methods for increased reliability of matching/no-matching operations on a key-data pattern comparison, and memories using the methods have been described. In particular, some embodiments introduce redundancy in a data pattern to lower a probability of errors and improve manufacturability of devices.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is intended that this disclosure be limited only by the claims and the equivalents thereof.

What is claimed is:

1. A method of pattern matching, comprising:
   receiving a pattern to be searched in a memory, the memory comprising a plurality of cell pairs, each cell pair of the plurality of cell pairs storing a bit of data corresponding to a particular bit position of the pattern and each cell pair of the plurality of cell pairs storing the same bit of data corresponding to the particular bit position of the pattern; and
   checking for the pattern to be searched in the memory;
   wherein, for each cell pair of the plurality of cell pairs, memory cells of that cell pair are connected in series;
   wherein one cell pair of the plurality of cell pairs is selectively connected to a particular data line;
   wherein a different cell pair of the plurality of cell pairs is selectively connected to the particular data line; and
   wherein the one cell pair of the plurality of cell pairs and the different cell pair of the plurality of cell pairs are selectively connected to each other through the particular data line.

2. The method of claim 1, wherein checking for the pattern comprises determining that a match condition is met for the particular bit position of the pattern when each cell pair of the plurality of cell pairs indicates a match to a data value of the particular bit position of the pattern.

3. The method of claim 1, wherein the plurality of cell pairs are aligned in parallel along the particular data line.

4. The method of claim 1, wherein a value of the particular bit position of the pattern to be searched is programmed into two bits of a register, and wherein gate voltages are applied to gates of the respective cells of each cell pair of the plurality of cell pairs responsive to the two programmed bits for checking for the pattern.

5. The method of claim 4, wherein a 0 value in the particular bit position of the pattern to be searched is coded as a first voltage in the first bit of the register and a second voltage in the second bit of the register; and wherein a 1 value in the particular bit position of the pattern to be searched is coded as the second voltage in the first bit of the register and the first voltage in the second bit of the register.

6. The method of claim 5, wherein a 0 value is coded in stored data as a first threshold voltage on a first memory cell of each cell pair of the plurality of cell pairs and a second threshold voltage on a second memory cell of each cell pair of the plurality of cell pairs, and a 1 value is coded in stored data as the second threshold voltage on the first memory cell of each cell pair of the plurality of cell pairs and the first threshold voltage on the second memory cell of each cell pair of the plurality of cell pairs.

7. The method of claim 1, wherein checking for the pattern comprises comparing selected programmed bits of the pattern to data stored in the memory.

8. The method of claim 7, wherein comparing results in a match condition when the cells are connected to a precharged data line which does not discharge.

9. The method of claim 7, wherein comparing results in a no-match condition when the cells are connected to a precharged data line which does discharge.

10. The method of claim 1, wherein the plurality of cell pairs comprises a first cell pair with memory cells connected in series on a first string of memory cells and a second cell pair with memory cells connected in series on a second string of memory cells.

11. The method of claim 10, wherein the first string of memory cells and the second string of memory cells are each selectively connected to the particular data line of the memory.

12. The method of claim 11, wherein the plurality of cell pairs further comprises a third cell pair with memory cells connected in series on a third string of memory cells and a fourth cell pair with memory cells connected in series on a fourth string of memory cells.

13. The method of claim 12, wherein the third string of memory cells and the fourth string of memory cells are each selectively connected to a data line of the memory different than the particular data line of the memory.

14. The method of claim 1, further comprising:
   wherein the plurality of cell pairs is a first plurality of cell pairs and the particular bit position of the pattern is a first particular bit position of the pattern;
   wherein the memory further comprises a second plurality of cell pairs, each cell pair of the second plurality of cell pairs storing a bit of data corresponding to a second particular bit position of the pattern and each cell pair of the second plurality of cell pairs storing the same bit of data corresponding to the second particular bit position of the pattern;
   wherein a first set of memory elements corresponding to a particular set of bit positions of the pattern comprising the first particular bit position of the pattern and the second particular bit position of the pattern comprises a first cell pair of the first plurality of cell pairs selectively connected to the particular data line and a first cell pair of the second plurality of cell pairs selectively connected to the particular data line;
   wherein a second set of memory elements corresponding to the particular set of bit positions of the pattern comprises a second cell pair of the first plurality of cell pairs selectively connected to the different data line and a second cell pair of the second plurality of cell pairs selectively connected to the different data line; and
   wherein the first set of memory elements and the second set of memory elements are each programmed to contain the same data.

15. A method of pattern matching, comprising:
   receiving a pattern to be searched in a memory, the memory comprising a first plurality of sets of memory elements and a second plurality of sets of memory elements, wherein a particular memory element of each set of memory elements of the first plurality of sets of memory elements and of the second plurality of sets of memory elements comprises a particular cell pair storing a bit of data corresponding to a particular bit position of the pattern with the particular cell pair of the particular memory element of each set of memory elements of the first plurality of sets of memory elements and of the second plurality of sets of memory elements storing the same bit of data corresponding to the particular bit position of the pattern, wherein each set of memory elements of the first plurality of sets of memory elements is selectively connected to a separate data line of a set of data lines, wherein each set of memory elements of the second plurality of sets of memory elements is selectively connected to a separate data line of the set of data lines, wherein each set of memory elements of the first plurality of sets of memory elements and of the second plurality of sets of memory elements corresponds to a same set of bit positions of the pattern, and wherein each set of memory elements of the first plurality of sets of memory elements and of the second plurality of sets of memory elements is programmed to contain the same data; and checking for the pattern to be searched in the memory;

wherein, for each cell pair of the plurality of sets of memory elements, memory cells of that cell pair are connected in series.

16. The method of claim 15, wherein a match condition is met when a majority of the data lines connected to the first plurality of sets of memory elements and to the second plurality of sets of memory elements indicates a match for the pattern to be searched.

17. The method of claim 15, wherein the first plurality of sets of memory elements comprises at least three sets of memory elements.

18. The method of claim 15, wherein the set of data lines comprises N data lines, and a matching condition is met when at least K data lines of the N data lines indicate a match condition, wherein K is greater than N/2.

19. The method of claim 15, wherein the particular memory element of each set of memory elements of the first plurality of sets of memory elements and of the second plurality of sets of memory elements comprises one or more cell pairs.

20. The method of claim 19, wherein the particular memory element of each set of memory elements of the first plurality of sets of memory elements and of the second plurality of sets of memory elements comprises two or more cell pairs connected in series in a same respective string of memory cells.

21. The method of claim 19, wherein the particular memory element of a set of memory elements of the first plurality of sets of memory elements and of a set of memory elements of the second plurality of sets of memory elements comprises two or more cell pairs aligned in parallel along its respective data line.

22. A method of pattern matching, comprising:

receiving a pattern to be searched in a memory, the memory comprising a plurality of cell pairs, each cell pair of the plurality of cell pairs storing a bit of data corresponding to a particular bit position of the pattern and each cell pair of the plurality of cell pairs storing the same bit of data corresponding to the particular bit position of the pattern; and checking for the pattern to be searched in the memory;

wherein, for each cell pair of the plurality of cell pairs, memory cells of that cell pair are connected in series.

23. The method of claim 22, wherein checking for the pattern comprises determining that a match condition is met for the particular bit position of the pattern when any cell pair of the plurality of cell pairs indicates a match to a data value of the particular bit position of the pattern.

24. The method of claim 22, wherein the plurality of cell pairs comprises two cell pairs on a same string of memory cells.

25. The method of claim 22, wherein the plurality of cell pairs are connected in series on a same string of memory cells.

* * * * *